United States Patent [19]

Grabbe et al.

[11] Patent Number: 5,015,191

[45] Date of Patent: May 14, 1991

[54] FLAT IC CHIP CONNECTOR

[75] Inventors: Dimitry G. Grabbe, Middletown; Joanne E. Shipe, Harrisburg, both of Pa.

[73] Assignee: AMP Incorporated, Harrisburg, Pa.

[21] Appl. No.: 488,595

[22] Filed: Mar. 5, 1990

[51] Int. Cl.⁵ .................. H01R 9/09; H01R 23/72
[52] U.S. Cl. ...................... 439/71; 439/66; 439/591
[58] Field of Search ............ 439/66, 71-74, 439/76, 591

[56] References Cited

U.S. PATENT DOCUMENTS

| | | | |
|---|---|---|---|
| 3,551,750 | 12/1970 | Sterling | 439/66 |
| 4,050,755 | 9/1977 | Hasircoglu | 439/71 |
| 4,130,327 | 12/1978 | Spaulding | 439/71 |
| 4,199,209 | 4/1980 | Cherian et al. | 439/591 |
| 4,511,197 | 4/1985 | Grabbe et al. | 339/17 |
| 4,513,353 | 4/1985 | Bakermans et al. | 361/399 |
| 4,684,184 | 8/1987 | Grabbe et al. | 439/64 |
| 4,699,593 | 10/1987 | Grabbe et al. | 439/71 |
| 4,905,194 | 3/1990 | Grabbe | 439/71 |
| 4,927,369 | 5/1990 | Grabbe et al. | 439/66 |
| 4,969,826 | 11/1990 | Grabbe | 439/66 |

Primary Examiner—Paula A. Bradley

[57] ABSTRACT

A separable flat integrated circuit chip connector (22) includes a plurality of contact spring members (44) maintained in a planar array by a dielectric holder (54). The planar array of the contact members (44) on the connector (22) corresponds to the planar arrays of contact pads on the surfaces of the integrated circuit package (14) and the printed circuit board (10) to which it is to be connected. A connector fastening assembly (24, 26) clamps and holds the conncetor (22) between the integrated circuit package (14) and the printed circuit board (10) to provide separable electrical connections between corresponding contact pads.

14 Claims, 4 Drawing Sheets

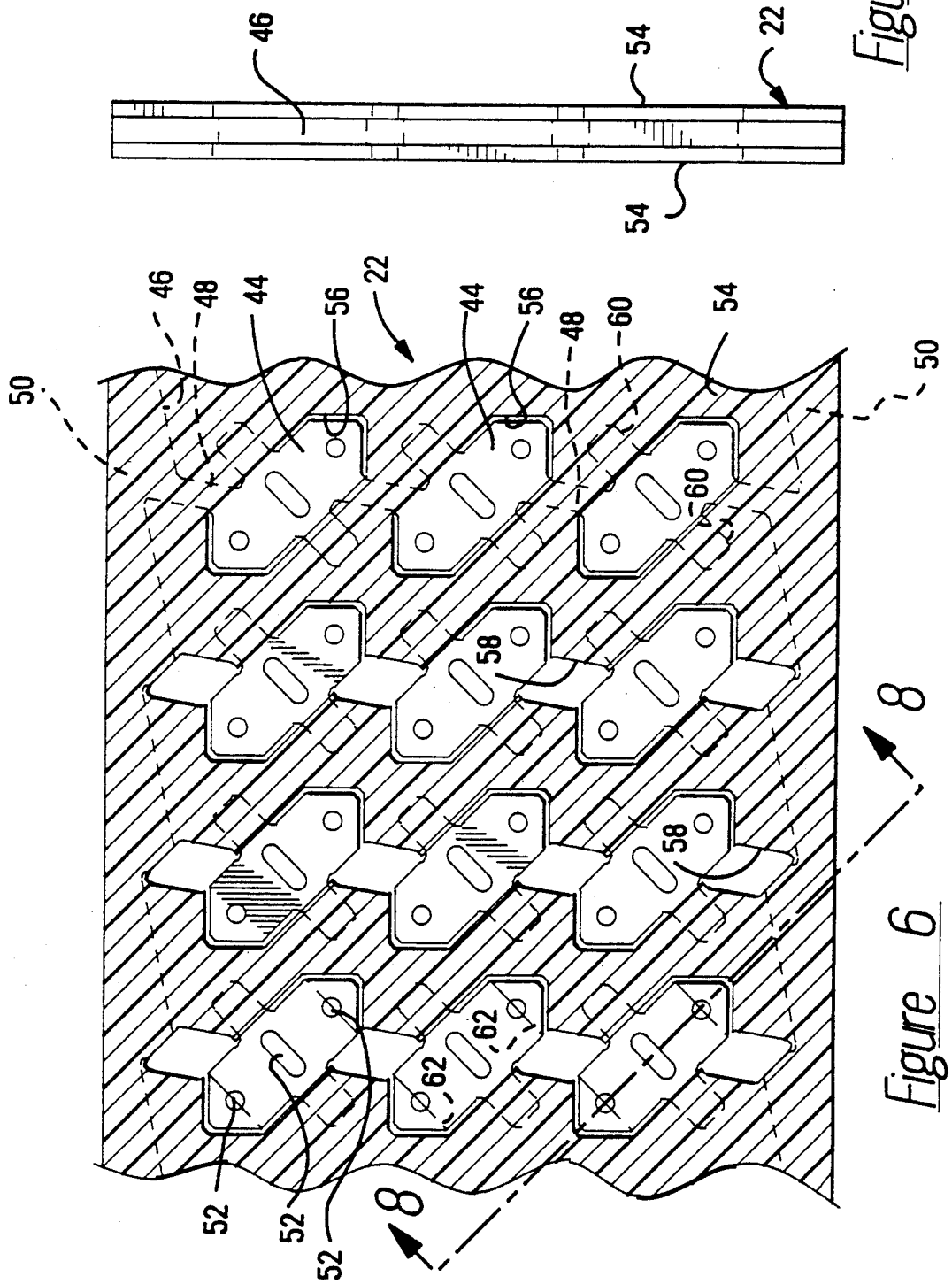

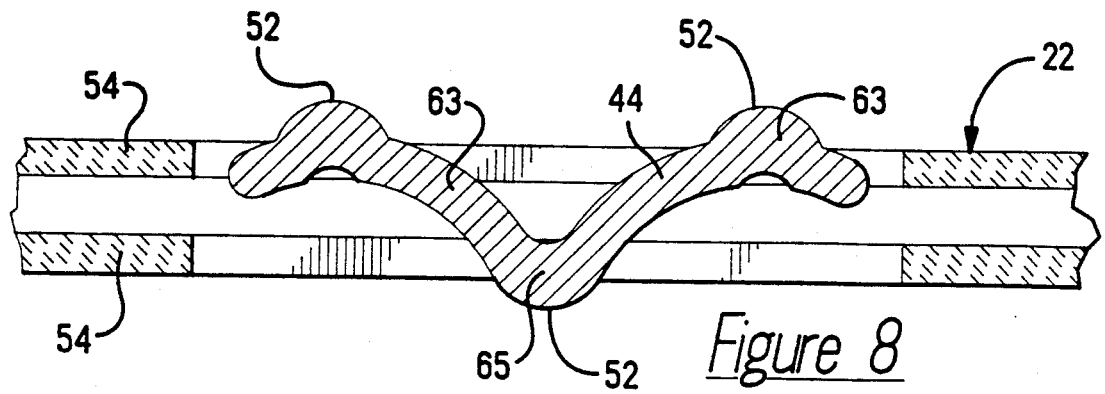
Figure 8
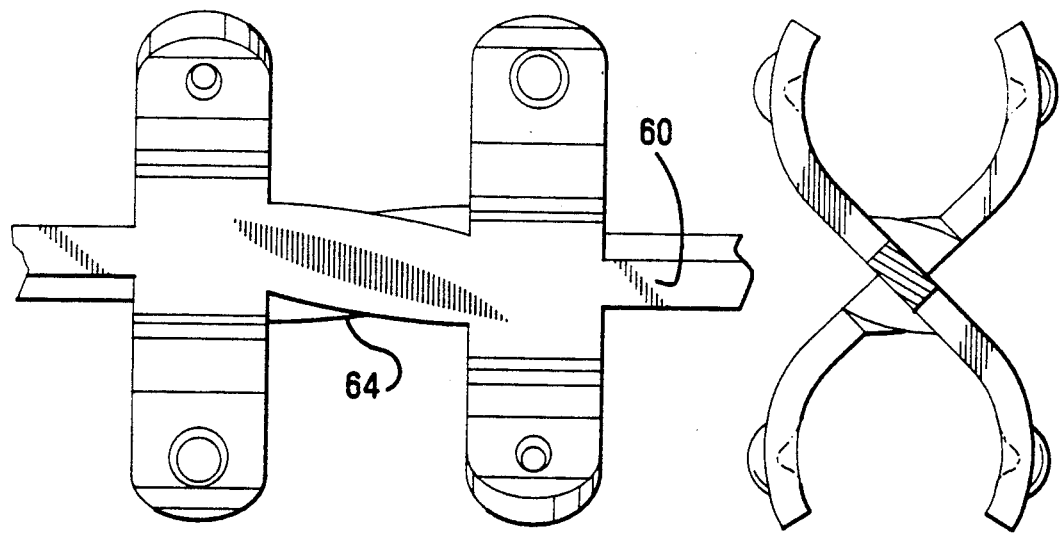
Figure 9A
Figure 9B

FLAT IC CHIP CONNECTOR

BACKGROUND OF THE INVENTION

This invention relates to connectors for connecting an integrated circuit chip carrier to a printed circuit board and, more particularly, a connector which provides a separable assembly and a relatively flat overall package.

When packaging an electronic component for a pocket or laptop computer, a requirement that must be strictly adhered to is that the height of the component when mounted on a printed circuit board must be kept to a minimum. Integrated circuit chips are conventionally carried on modules which are like miniature printed circuit boards on which an interconnection pattern and contact pads are deposited. For use in lap-top and pocket computers there is presently being developed a new integrated circuit package which consists of a thin printed circuit board having an array of plated through holes. The bottom side of the circuit board has an array of contact pads, each connected to a corresponding plated through hole. Each contact pad has an electrical connection through the hole to the top side of the circuit board, which is typically very thin, permitting the diameter of the plated through holes to be very small, for example on the order of 0.004 inches. On the top side of the circuit board, there is an area designated for mounting the integrated circuit chip, surrounded by pads, to which wire bonding or tape automated bonding, or the like, from the chip can be made. These pads are typically arranged in a rectangular pattern, corresponding to the perimeter array of bonding pads on the integrated circuit chip. From these pads, conductors extend, each to a corresponding plated through hole on the circuit board. Accordingly, each of the chip pads is electrically connected to a corresponding contact pad on the bottom of the printed circuit board.

After the integrated circuit chip is attached to the printed circuit board, the board is inserted into a mold and plastic is injected, encapsulating the chip and a substantial portion of the area of the printed circuit board on the surface carrying the chip. In the area outside the chip, the injected plastic enters the plated through holes. Since injection molded plastic has no adhesive-like bonding characteristic to the material over which it is injected, the mechanical anchoring is attained by the plastic entering the holes, which by virtue of the manufacturing process have substantially uniformly distributed surface irregularities and a substantial anchoring force is thereby achieved.

In one version of this package, the bottom side of the printed circuit board which is populated with contact pads, is further populated with solder balls. This subassembly is then placed on top of a larger circuit board, which has corresponding contact pads and the part is reflowed or soldered in place. This method of attachment of a component to a circuit board has two major disadvantages. A first disadvantage is that due to the mismatch of the coefficients of expansion, the size of the package is limited to very small dimensions, such as for example ¼ inch square. Larger parts attached in this manner will suffer fracture of the solder connections. A second disadvantage is that there are many circumstances when in addition to requiring larger packages and larger numbers of leads, a separable package is required. In addition to the requirement of separability, which can be met by assemblies such as those disclosed in U.S. Pat. No. 4,699,593, there are additional requirements of densities at which the assembly disclosed in the referenced patent becomes impractical, and the height of such an assembly is excessive, especially in the case of satisfying the requirements for laptop or pocket computers.

It is therefore a primary object of the present invention to provide a separable connector assembly which achieves high density connection of an integrated circuit chip module to a printed circuit board.

It is a further object of this invention to provide such an assembly in a flattened structure which satisfies the requirements of laptop or pocket computers.

SUMMARY OF THE INVENTION

The foregoing and additional objects are attained in accordance with the principles of this invention by providing an electrical connector which includes a plurality of contact members held in a planar array by a dielectric holding means. The contact members each have bent portions which extend out of the plane of the array in opposite directions for engagement with respective ones of planar arrays of contact pads of the component and the circuit boards to be interconnected.

In accordance with an aspect of this invention, there is provided a connector assembly which includes the aforedescribed connector as well as fastening means for locating and holding the connector between substrates having surfaces on which the contact pads are arrayed.

In accordance with another aspect of this invention, a method of constructing the connector is provided which comprises the steps of providing a conductive sheet, removing material from the conductive sheet so as to leave an array of areas of material, each of the areas having a predetermined configuration for use as a contact member, the areas of material being interconnected by relatively narrow strips of material, providing two layers of dielectric material, perforating the dielectric material layers to form apertures in a pattern corresponding to the array of contact member material on the conductive sheet, forming a laminate of the conductive sheet between the two layers of dielectric material, and perforating the laminate in a pattern corresponding to the narrow strips so as to sever the narrow strips and separate the areas of contact member material from each other, while the remaining webs of the insulating sheets continue to hold the now separate contact members in accurate, predetermined positions relative to each other.

BRIEF DESCRIPTION OF THE DRAWINGS

The foregoing will be more readily apparent upon reading the following description in conjunction with the drawings in which like elements in different figures thereof have the same reference numeral and wherein:

FIG. 6 is a top plan view of a connector which may be used in the assembly of FIG. 1 illustrating stages in its formation;

FIG. 7 is an end view of the connector of FIG. 6;

FIG. 8 is an enlarged cross-sectional view taken along the line 8—8 in FIG. 6; and FIGS. 9A and 9B are plan and end views, respectively, of an alternate embodiment of a contact member for the connector of FIG. 6.

DETAILED DESCRIPTION

Figure 1:
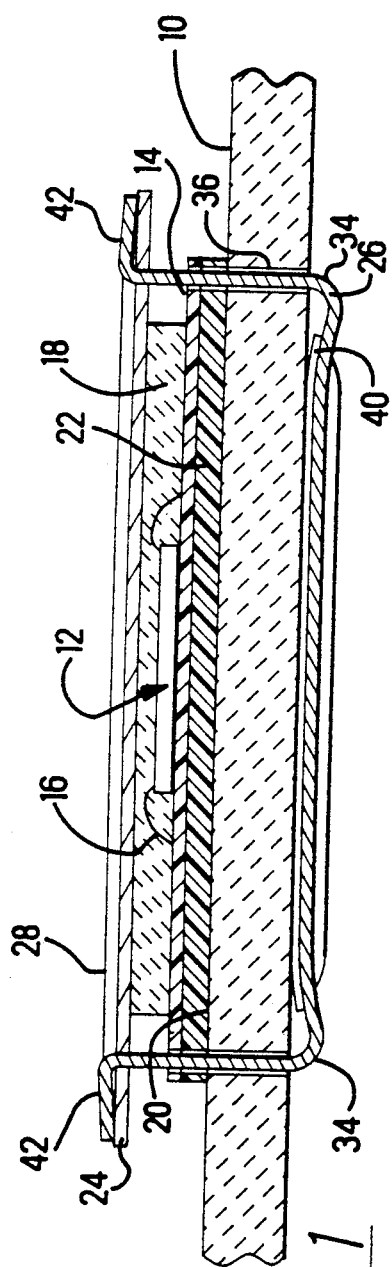
FIG. 1 is a longitudinal cross-sectional view, taken along the line 1—1 in FIG. 2, of an electrical connector assembly constructed in accordance with the principles of this invention.
Figure 2:
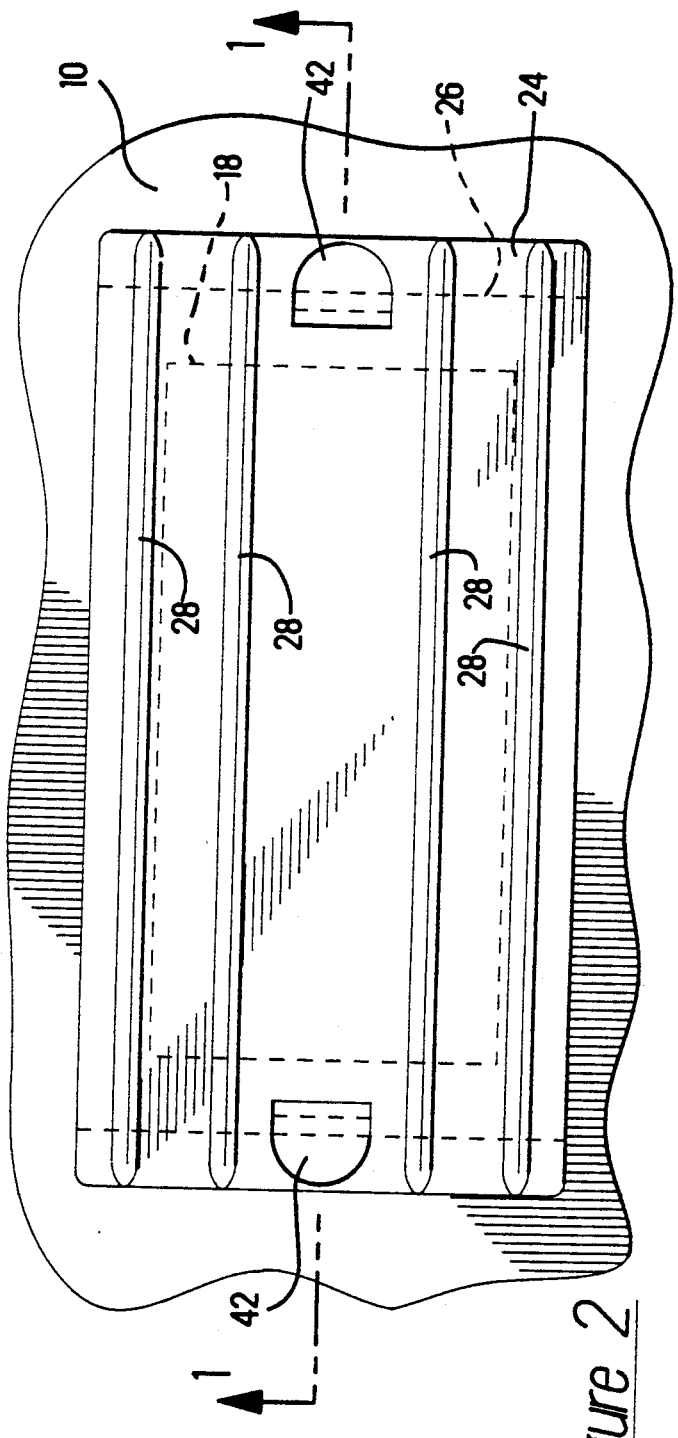
FIG. 2 is a top plan view of the assembly of FIG. 1.
Figure 3:
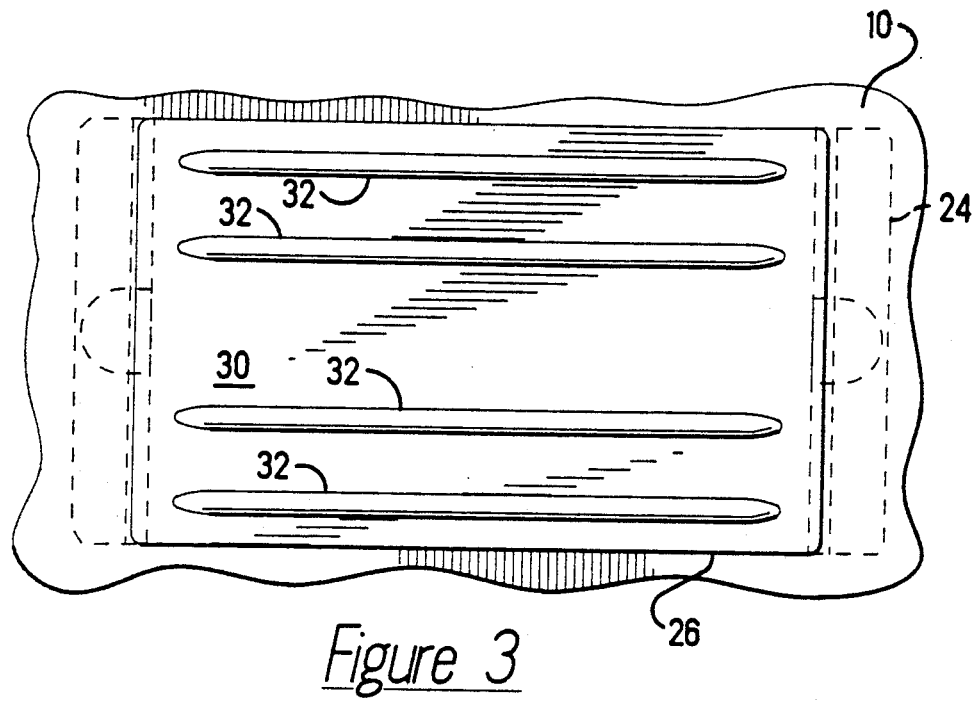
FIG. 3 is a bottom plan view of the assembly of FIG. 1.
Figure 4:
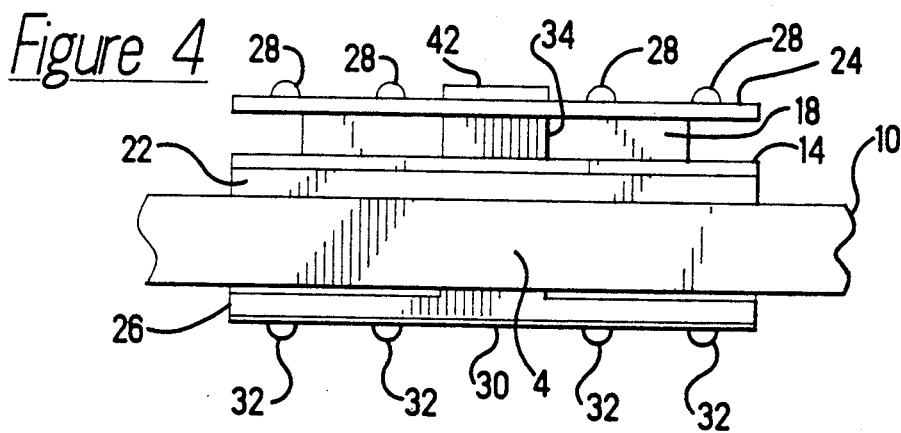
FIG. 4 is an end view of the assembly of FIG. 1.

FIG. 1 illustrates a longitudinal cross-sectional view through an electrical connector assembly constructed in accordance with the principles of this invention. The connector assembly is operative to mount an integrated circuit package onto a system printed circuit board 10 in a separable manner while at the same time making electrical connections between contact pads on the integrated circuit package and contact pads on the system printed circuit board 10. The integrated circuit package includes an integrated circuit chip 12 mounted on a miniature printed circuit board 14 by means of wires 16. The chip 12 is over-molded by plastic 18. As previously described, the miniature circuit board 14 is perforated with plated through holes, preferably in a rectangular array. On the underside of the miniature circuit board 14, contact pads are provided, each associated with a respective plated through hole and in contact therewith. The wires 16 are attached to contact pads on the upper surface of the circuit board 14, from which contact pads conductors fan out to respective plated through holes. Therefore, each of the wires 16 is associated with a corresponding contact pad on the underside of the miniature printed circuit board 14. The system printed circuit board 10 has on its upper surface 20 an array of contact pads corresponding to the contact pads on the lower surface of the miniature circuit board 14, or similar component. The function of the electrical connector assembly according to this invention is to provide and maintain a separable connection between corresponding ones of the contact pads on the lower surface of the component, such as for example, the miniature circuit board 14 and the upper surface of the system printed circuit board 10.

To provide that function, the connector assembly according to the present invention includes a flat connector 22, to be described in full detail hereinafter, along with fastening means for locating and holding the connector 22 between the system printed circuit board 10 and the miniature printed circuit board 14, with corresponding respective contact members of the connector 22 engaged with contact pads of the circuit boards 10 and 14. Illustratively, this fastening means includes a cover member 24 and a clamp member 26. The cover member 24 is relatively rigid and planar and preferably includes a plurality of reinforcing ribs 28. The clamp member 26 has a substantially planar base member 30 which, like the cover member 24, is relatively rigid and includes a plurality of reinforcing ribs 32. The clamp member 26 also includes a pair of extension members 34 which are spaced apart and extend substantially orthogonal to the base member 30. The system printed circuit board 10, the connector 22, and the miniature printed circuit board 14 are formed with apertures 36 which are so situated in their respective elements that they are in alignment when the system printed circuit board 10, the connector 22, and the miniature printed circuit board 14 are stacked so that the corresponding contact pads on the circuit boards 10 and 14 are connected via the contact members of the connector 22. The extension members 34 pass through the sets of aligned apertures 36 and also through additional apertures 38 in the cover member 24.

Figure 5:
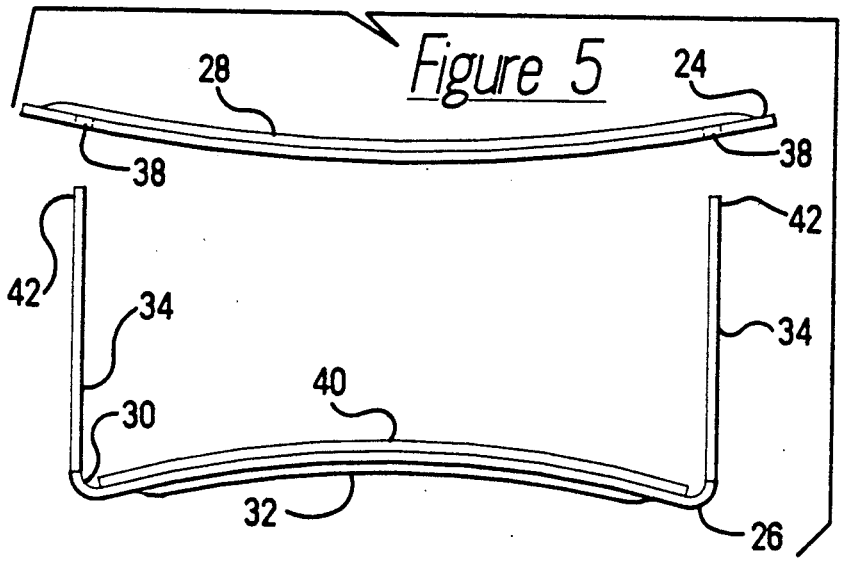
FIG. 5 is an exploded view of the fastening members of the assembly of FIG. 1.

As is best shown in FIG. 5, the cover member 24 and the clamp member 26 are preferably deformed, or bowed, in their free states in such a manner so that when assembled, the curved portions or surfaces will be forced to a planar configuration and made essentially flat, with the force per unit area essentially uniform over the area of physical contact between the components. Alternatively, the cover member 24 and the base member 30 can be rigid plates. Thus, for assembly, the base portion of the clamp member 26 is placed against the lower surface of the system printed circuit board 10 with the extension members 34 extending through the apertures 36. If desired, an insulator 40 may be inserted between the base portion 30 and the circuit board 10. The distal ends 42 of the extension members 34 are inserted through the apertures 38 of the cover member 24. The assembly is then compressed to flatten the cover member 24 and the clamp member 26 and the distal ends 42 of the extension members 34 are then bent or twisted or secured by other means, such as by lateral displacement, or even the use of additional components such as, for example, "timmerman" nuts, so that they cannot subsequently be withdrawn through the apertures 38. This manner of assembly results in the application of a compressive force to the connector 22 through the system printed circuit board 10 and the miniature printed circuit board 14.

An illustrative form for the connector 22 and a method of its construction is depicted in FIG. 6. As shown therein, each of the individual contact members of the connector 22 is a contact spring member 44. The contact spring members 44 are formed from a conductive sheet 46 which has had material removed therefrom to leave an array of areas of material 44 interconnected by relatively narrow strips of material 48 along with peripheral strips 50 which function to provide structural support for the conductive sheet 46 prior to it being imbedded in a dielectric holder, as will be described in full detail hereinafter. The removal of material may be effected in any desired manner such as, for example, by means of electrochemical machining, stamping, or the like. During this process, contact points 52 are formed on the contact members 44. In its final assembly, the conductive sheet 46 is sandwiched between two layers 54 of a dielectric material, illustratively polyimide film. The layers 54 are bonded to the conductive sheet 46 adhesively or in some other suitable manner. Prior to being bonded to the conductive sheet 46, the dielectric layers 54 are perforated in a pattern corresponding to the placement of the contact members 44. This pattern also corresponds to the pattern of contact pads on the printed circuit boards 10 and 14. The resultant apertures 56 in the dielectric layers 54 are so sized that when positioned against the printed circuit boards 10 and 14 they do not extend beyond the areas occupied by the contact pads on the printed circuit boards.

After the conductive sheet 46 is machined and the dielectric layers 54 are perforated, as described above, the sheet 46 and the layers 54 are aligned and bonded into a laminate. The resultant structure is illustrated by the rightmost column of elements in FIG. 6. The next step is the perforation, by means of stamping, laser cutting, or the like, of areas of the laminate corresponding to the connecting strips 48 so as to sever the strips and separate the contact members 44 from each other. This results in a plurality of apertures 58 and is illustrated in the two central columns of elements in FIG. 6. It will be noted from FIG. 6 that each of the contact members 44 have been formed with tabs 60 which, after formation of the perforations 58, still remain sandwiched between the dielectric layers 58 to provide structural support for the contact members 44 which keeps them in position The next step is the bending of the contact members 44 along the bend lines 62 so that, as best illustrated in FIG. 8, the contact points 52 on the bent portions 63, 65 extend outwardly beyond the surfaces of the laminate forming the connector 22. This results in contact members 44 which have stored energy so that when the laminate 22 is compressed between the circuit boards 10 and 14 to form the completed assembly, as described above, appropriate contact forces are generated.

The configuration of the contact members 44 is not restricted to any particular shape. While a substantially rectangular shape has been illustrated in FIGS. 6 and 8, the dog-bone configuration shown in FIGS. 9A and 9B may be advantageous since the region 64 operates as a torsional spring to provide a very compliant structure.

Although the use of layers of film for the dielectric holding the contact members has been illustrated, other manufactures are possible. For example, injection molding of the dielectric holder is also possible. Such a molded dielectric holder could, illustratively, comprise two relatively thin and flat pieces with appropriate apertures and locating recesses for accommodating the contact members, which pieces could be snap-fit together. Further, other ways of joining the cover member 24 and the clamp member 26 are contemplated as falling within the scope of this invention. Thus, threadedly engaging members (such as nuts and bolts) may extend through suitable locating apertures. Alternatively, the cover member may be slid into a receiving groove. Additionally, although locating apertures have been described, some of the elements, such as the connector 22 or the miniature circuit board 14, may have locating notches in place of the locating apertures. Also, the shape of the reinforcing ribs on the cover member 24 and the clamp member 26 is not limited to a straight line, as other patterns may be appropriate.

Accordingly, there has been disclosed an improved flat integrated circuit chip connector. While a preferred embodiment has been disclosed, it will be apparent to those skilled in the art that various modifications to the disclosed embodiment may be made and it is only intended that the scope of this invention be limited by the appended claims.

We claim:

1. An electrical connector (22) for electrically connecting contact pads arranged in an array on a planar surface of a first substrate (10) to respective contact pads arranged in a corresponding array on a planar surface of a second substrate (14), comprising:
    a plurality of electrically conductive and generally planar contact members (44);
    dielectric holding means (54) for holding said contact members (44) generally coplanar to each other and in a planar array corresponding to the arrays of said contact pads;
    each of said contact members (44) having bent portions (63, 65) with at least one bent portion (63) extending out of the plane of said each contact member and said planar array of contact members in a first direction and at least one bent portion (65) extending out of the plane of said each contact member and said planar array of contact members in a second direction; and
    said dielectric holding means (54) being arranged (56) to expose the bent portions (63, 65) of said contact members (44) for engagement with respective ones of said contact pads.

2. The connector according to claim 1 wherein said dielectric holding means includes:
    a first layer of dielectric material disposed on a first side of the contact members;
    a second layer of dielectric material disposed on the opposite side of the contact members; and
    means for securing said contact members between said first and second layers.

3. The connector according to claim 2 wherein said securing means includes adhesive applied to the surface of each of said layers that engages the contact members.

4. The connector according to claim 2 wherein said layers are perforated so as to expose the bent portions of the contact members.

5. An electrical connector assembly for electrically connecting contact pads arranged in an array on a planar surface of a first substrate (10) to respective contact pads arranged in a corresponding array on a planar surface of a second substrate (14), comprising:
    a connector (22) including:
        a plurality of electrically conductive and generally planar contact members (44);
        dielectric holding means (54) for holding said contact members (44) generally coplanar to each other and in a planar array corresponding to the arrays of said contact pads;
        each of said contact members (44) having bent portions (63, 65) with at least one bent portion (63) extending out of the plane of said each contact member and said planar array of contact members in a first direction and at least one bent portion (65) extending out of the plane of said each contact member and said planar array of contact members in a second direction; and
        said dielectric holding means (54) being arranged (56) to expose the bent portions of said contact members (44) for engagement with respective ones of said contact pads; and
    fastening means (24, 26) for locating and holding said connector (22) between said first and second substrates (10, 14) so that the bent portions (63, 65) of the contact members (44) engage respective corresponding ones of the contact pads on the first and second substrates (10, 14).

6. The assembly according to claim 5 wherein said first and second substrates (10, 14) and said connector (22) are each formed with a plurality of apertures (36) which are in alignment when said first and second substrates (10, 14) and said connector (22) are stacked so that the contact pads of said first and second substrates (10, 14) are connected via said connector (22), and said fastening means (24, 26) includes locating means (34) extending through at least two sets of said aligned apertures (36).

7. The assembly according to claim 6 wherein said fastening means further includes:
    a first member (24) on the side of said second substrate (14) opposite the contact pads;

a second member (30) on the side of said first substrate (10) opposite the contact pads; and means (38, 42) for coupling said first and second members (24, 30) to said locating means (34) so as to apply a compressive force to said connector (22) through said first and second substrates (10, 14).

8. The assembly according to claim 7 wherein said first (24) and second (30) members are relatively rigid and are bowed toward said first and second substrates (10, 14) in their free states, said coupling means (38, 42) being arranged to flatten said first and second members (24, 30) upon coupling said first and second members (24, 30) to said locating means so as to apply a substantially uniform force per unit area to said first and second substrates (10, 14).

9. The assembly according to claim 6 wherein said fastening means further includes:

a cover member (24) on the side of said second substrate (14) opposite the contact pads;

a clamp member (26) on the side of said first substrate (10) opposite the contact pads, said clamp member (26) having a base portion (30) and a pair of spaced apart elongated extension members (34) extending from and substantially orthogonal to said base portion (30), each of said extension members (34) extending through a respective set of said aligned apertures (36); and means (38) for attaching the distal ends (42) of said extension members (34) to said cover member (24) so as to apply a compressive force to said connector (22) through said first and second substrates (10, 14).

10. The assembly according to claim 9 wherein:

said cover member (24) is relatively rigid, substantially planar, and bowed toward said second substrate (14) in its free state;

said base portion (30) of said clamp member (26) is relatively rigid, substantially planar, and bowed toward said first substrate (10) in its free state;

said cover member (24) and said base portion (30) becoming flattened upon attachment of the distal ends (42) of said extension members (34) to said cover member (24) so as to apply a substantially uniform force per unit area to said first and second substrates (10, 14).

11. The assembly according to claim 9 wherein said cover member (24) is formed with a pair of spaced apart apertures (38) each adapted to accept the distal end (42) of a respective extension member (34) therethrough and said attaching means includes portions formed on the distal ends (42) of said extension members (34) adapted to be bent after insertion through a respective cover member aperture (38) to prevent the subsequent withdrawal therefrom.

12. The assembly according to claim 5 wherein said dielectric holding means includes:

a first layer of dielectric material disposed on a first side of the contact members;

a second layer of dielectric material disposed on the opposite side of the contact members; and means for securing said contact members between said first and second layers.

13. The assembly according to claim 12 wherein said securing means includes adhesive applied to the surface of each of said layers that engages the contact members.

14. The assembly according to claim 12 wherein said layers are perforated so as to expose the bent portions of the contact members.

* * * * *